United States Patent
Funakubo et al.

(10) Patent No.: US 7,858,919 B2
(45) Date of Patent: Dec. 28, 2010

(54) PHOTO REFLECTOR INCLUDING A LIGHT-EMITTING ELEMENT AND A LIGHT-RECEIVING ELEMENT

(75) Inventors: Kazuo Funakubo, Hachioji (JP); Akira Watanabe, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 5 days.

(21) Appl. No.: 12/245,353

(22) Filed: Oct. 3, 2008

(65) Prior Publication Data
US 2009/0095881 A1 Apr. 16, 2009

(30) Foreign Application Priority Data
Oct. 3, 2007 (JP) .............................. 2007-259633

(51) Int. Cl.
*G01J 1/32* (2006.01)
(52) U.S. Cl. .................. 250/216; 250/205; 250/227.28; 250/239
(58) Field of Classification Search ................ 250/221, 250/239, 216, 205, 227.28; 359/493
See application file for complete search history.

(56) References Cited

U.S. PATENT DOCUMENTS

| | | | | | |
|---|---|---|---|---|---|
| 5,397,890 | A | * | 3/1995 | Schueler et al. | 250/221 |
| 5,796,858 | A | * | 8/1998 | Zhou et al. | 382/127 |
| 2003/0020004 | A1 | * | 1/2003 | Reime | 250/214 SW |
| 2007/0090282 | A1 | * | 4/2007 | Chin et al. | 250/231.13 |
| 2007/0237504 | A1 | * | 10/2007 | Nakashiba | 396/15 |
| 2008/0079105 | A1 | * | 4/2008 | Chang et al. | 257/434 |

FOREIGN PATENT DOCUMENTS

JP      2001156325 A   12/2008

* cited by examiner

*Primary Examiner*—Tony Ko
(74) *Attorney, Agent, or Firm*—Browdy and Neimark, PLLC

(57) ABSTRACT

A photo reflector (30) includes a circuit board (32) provided with electrode patterns, a light-emitting element (42) and a light-receiving element (44) disposed on the circuit board, a light-transmitting resin sealing the light receiving element (44), and a light shielding member (50) provided on the circuit board to cover peripheral side surfaces of the first light-transmitting resin and the second light-transmitting resin except for upper surfaces thereof. A light-intensity adjuster (60) to adjust the photocurrent is provided on the light-transmitting resin.

6 Claims, 5 Drawing Sheets

PHOTO REFLECTOR INCLUDING A LIGHT-EMITTING ELEMENT AND A LIGHT-RECEIVING ELEMENT

CROSS REFERENCE TO THE RELATED APPLICATION

The application claims the priority benefit of Japanese Patent Application No. 2007-259633, filed on 3 Oct. 2007, the entire descriptions of which are incorporated herein by reference.

BACKGROUND OF THE INVENTION

1. Field of the Invention

The present invention relates to a photo reflector configured to detect an object by a light-emitting element emitting light toward the object, and a light-receiving element receiving the reflected light after the light being reflected on the detected object and converting the reflected light into a photocurrent in the light-receiving element.

2. Description of the Related Art

A conventional photo reflector of this kind is shown in FIGS. 8 and 9. The conventional photo reflector 16 as shown in FIGS. 8 and 9 includes a circuit board 20 provided with electrode patterns 18, a light-emitting element 22 and a light-receiving element 24 which are electrically connected to the electrode patterns 18 of the circuit board 20, respectively, and a light-shielding frame 26 which is provided on the circuit board 20 to surround the light-emitting element 22 and the light-receiving element 24 and has an partition wall 26b to partition and optically shield the light-emitting element 22 and the light-receiving element 24 (for reference, see Japanese Patent Laid Open No. 2001-156325).

In the photo reflector 16, the light-emitting element 22 and the light-receiving element 24 are positioned to be close to each other in one side with the partition wall 26b disposed between the light-emitting element 22 and the light-receiving element 24. The light-shielding frame 26 shields unnecessary light and the partition wall 26b prevents direct light of the light-emitting element 22 from entering the light-receiving element 24.

However, the photo reflector 16 having the aforementioned structure has variations in light-emission intensity of the light-emitting element 22 and light-receiving sensitivity of the light-receiving element 24. Consequently, a photocurrent value determined by a combination characteristic (sensor sensitivity characteristic) of light-emitting element and light-receiving element in the photo reflector 16 tends to have a significant variation in which the maximum value may be about three-time value of the minimum value. This variation not only depends on the inherent characteristics of the light-emitting element 22 or the light-receiving element 24, but may also occur with each lot in a manufacturing step.

When there is this kind of variation in the photocurrent value, it is feared a fear that products cannot be stably provided due to a large number of defective products occurring in the pre-shipping inspection.

In addition, the conventional photo reflector is produced after carrying out design of such factors as selection of the light-emitting element or light-receiving element, or shape or size of the light-shielding wall, upon previous consideration of characteristics such a photocurrent or the like. However, until a final product is once manufactured, it is not possible to determine whether the product satisfies the characteristics as designed. Therefore, if a product does not satisfy the conditions as designed in the final inspection, it is not possible to ship it as a product, and the process yield of the products is reduced.

SUMMARY OF THE INVENTION

An object of the present invention is to provide a photo reflector capable of reducing variation in a photocurrent determining the sensitivity characteristic of a light-receiving element and finely adjusting the photocurrent to comply with a predetermined range.

To accomplish the above object, a photo reflector according to an embodiment of the present invention includes a circuit board, a light-emitting element disposed on the circuit board to emit light toward an object to be detected, a light-receiving element disposed on the circuit board at an interval from the light-emitting element to receive the light after the light being emitted from the light-emitting element and reflected on the object, and the light-receiving element converting the reflected light into a photocurrent, and a light-intensity adjuster disposed in an optical path of the light that is emitted from the light-emitting element toward the object and received by the light-receiving element after the light being reflected on the object.

A photo reflector according to another embodiment of the present invention includes a circuit board, a light-emitting element disposed on and electrically connected to the circuit board, the light-emitting element to emit light toward an object to be detected, a light-receiving element disposed on and electrically connected to the circuit board, the light-receiving element to receive the light after the light being reflected on the object, the light-emitting element and the light-receiving element being disposed side by side with an interval between the light-emitting element and the light-receiving element, a light-transmitting resin sealing the light-emitting element and the light-receiving element, a light-shielding member provided in contact with the light-transmitting resin, an a light-intensity adjuster provided on the light-transmitting resin, and the light-intensity adjuster disposed in an optical path of the light that is emitted from the light-emitting element toward the object, and redirected toward the light-receiving element after being reflected on the object.

A photo reflector according to another embodiment of the present invention includes a circuit board, a light-emitting element disposed on the circuit board to emit light toward an object to be detected, a light-receiving element disposed on the circuit board to receive the light after the light being reflected on the object, the light-emitting element and the light-receiving element being disposed side by side with an interval between the light-emitting element and the light-receiving element, a light-transmitting resin sealing at least the light-receiving element, and a light-intensity adjuster provided on the light-transmitting resin, the light intensity adjuster being disposed in an optical path of the light reflected on the object and redirected to the light-receiving element.

In addition, the light-intensity adjuster may be a laser mark. The laser mark may include a concave- and convex-shaped roughed surface, which may be formed by melting a part of the light-transmitting resin. Also, a roughness of the laser mark may be set by a combination of conditions such as intensity, time, and area of laser radiation. A laser mark may be formed by either one of a YAG laser and a carbon dioxide gas laser. A photocurrent may be adjusted by a laser mark.

DETAILED DESCRIPTION OF THE PREFERRED EMBODIMENTS

Preferred embodiments of the present invention will be explained in detail hereinafter with reference to the accompanying drawings.

Figure 1:
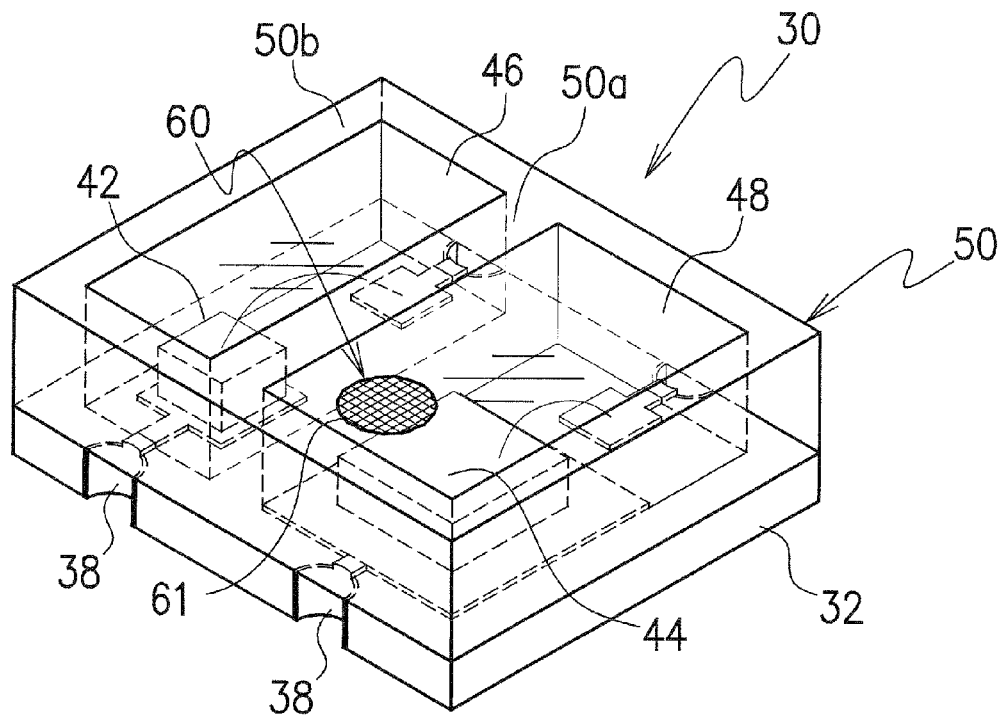
FIG. 1 is a perspective view showing a photo reflector according to an embodiment of the present invention.

Referring to FIG. 1, a photo reflector 30 according to an embodiment of the present invention is illustrated. The photo reflector 30 includes a circuit board 32, a light-emitting element 42 and a light-receiving element 44 which are mounted on the circuit board 32, sealing members, here, a first light-transmitting resin 46 and a second light-transmitting resin 48 which are configured to seal the light-emitting element 42 and the light-receiving element 44, respectively, and a light-shielding member 50 configured to cover peripheral side surfaces of the light-emitting element 42 and the light-receiving element 44. In the embodiment, the light-emitting element 42 and the light-receiving element 44 are disposed side by side on the circuit board 32 with an interval between the light-emitting element 42 and the light-receiving element 44.

The light-emitting element 42 is configured to emit light upward to an object 62 to be detected, and the light-receiving element 44 (see FIG. 3) is configured to receive light after the light being reflected on the object 62 and then convert the reflected light into a photocurrent. The photocurrent is processed by a controller (not shown).

The object 62 is configured to be detected based on variation in a value of the photocurrent flowing in the light-receiving element 44.

The circuit board 32 is made of, for example, glass epoxy resin, BT (Bismaleimide Triazine) resin or the like and formed in a thin flat square shape (see FIG. 1). An electrode pattern 34 electrically connected to the light-emitting element 42, and an electrode pattern 36 electrically connected to the light-receiving element 44 are provided on the circuit board 32 (see FIG. 2). For example, two through-holes as exterior connection terminals 38 each having a semicircular shape in section are provided in each of two opposite sides of the circuit board 32 (see FIG. 1). In addition, electrode patterns 40 provided on an outside bottom surface of the circuit board 32 electrically connected through the exterior connection terminals 38 to the electrode patterns 34 and 36 (see FIG. 3).

The electrode pattern 34 and the electrode pattern 36 in this embodiment are structured by electrode portions 34a, 36a for die bonding and electrode portions 34b, 36b for wire bonding.

The light-emitting element 42 comprises, for example, a light-emitting diode (LED), and the light-receiving element 44 comprises, for example, a photo diode. The light-emitting element 42 and the light-receiving element 44 are die-bonded to the electrode portions 34a, 36a for die bonding and wire-bonded to the electrode portions 34b, 36b for wire-bonding.

In the photo reflector 30 as shown in FIG. 1, the first light-transmitting resin 46 has an upper surface as a light-emitting surface and peripheral side surfaces and the second light-transmitting resin 48 has an upper surface as a light-receiving surface and peripheral side surfaces. The light-shielding member 50 covers the peripheral side surfaces of the first and second light-transmitting resins 46 and 48, and thus the light emitted from the light-emitting element 42 is directed to the object passing above the light-emitting surface and the light reflected on the object is redirected to the light-receiving surface of the light-receiving element 44.

Figure 2:
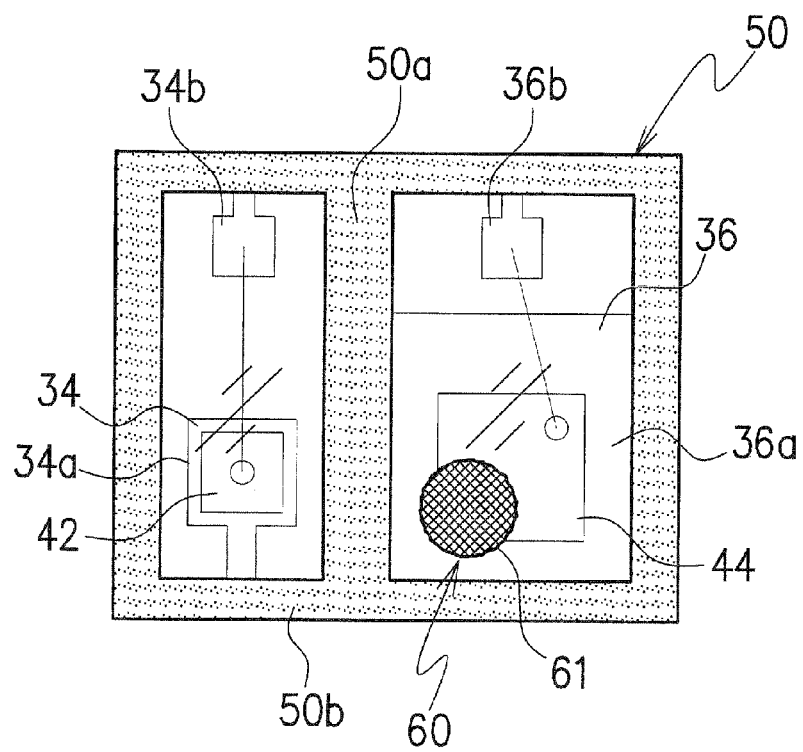
FIG. 2 is a plan view of the photo reflector shown in FIG. 1.

The light-shielding member 50, which surrounds peripheral side surfaces of the first and second light-transmitting resins 46 and 48, is made of a resin includes a material such as carbon or black-colored substance to cut visible light or infra-red light is contained and includes a partition wall 50a formed between the light-emitting element 42 and the light-receiving element 44, and an outer peripheral wall 50b formed to surround peripheral side surfaces of the first and second light-transmitting resins 46 and 48 (see FIG. 2).

The electrode portion 36a on which the light-receiving element 44 is mounted is extended to the light-shielding member 50 with a necessary space to other electrode portions for electrical isolation. The electrode portion 36a has an area wider than that of a mounted surface of the light-receiving element 44 and formed to extend in contact with the partition wall 50a and the area has a portion overlapping with lower surfaces of the partition wall 50a and the outer peripheral wall 50b of the light shielding member 50 (see FIG. 2).

Each of the first and second light-transmitting resins 46 and 48 sealing the light-emitting element 42 and the light-receiving element 44, respectively, is made of any light-transmitting resin. The first and second light-transmitting resins 46 and 48 are configured to cover the light-emitting element 42 and the light-receiving element 44, and electrical connections such as bonding wires and the electrode patterns 34 and 36.

In the photo reflector 30 having the aforementioned structure, the light-shielding member 50 prevents emission of light from regions between the light-emitting element 42 and the light-receiving element 44 and from the periphery of the light-emitting element 42 and the light-receiving element 44, and therefore only a plan surface of the photo reflector 30, in other words, upper surfaces (in FIGS. 1 and 3) above the light-emitting element 42 and the light-receiving element 44 are formed as light-emitting and light-receiving surfaces which correspond to the emission surface and the light-receiving surface, respectively.

Because the electrode portion 36a of the electrode pattern 36 extends at three edges thereof in contact with and partly overlapping with lower surfaces of the partition wall 50a and the outer peripheral wall 50b, undesired light emitted from the light-emitting element and traveling in the circuit board 32 is also shielded by the electrode portion 36a.

In the photo reflector 30 having the aforementioned structure, in an inspection process after the photo reflector is produced, the photocurrent value in the light-receiving element is ranked. The photocurrent value is determined by supplying a forward current of about 5.00 mA to the light-emitting element 42 by means of a constant-current power supply (not shown), while at the same time applying a voltage of about 5.00V between a collector and an emitter of the light-receiving element 44 by a constant-voltage power supply (not shown), and calculating a collector current Ic flowing in the light-receiving element 44. Here, based on collector currents Ic calculated with respect to some light-receiving elements, photocurrent values in various reference ranges are classified into groups G1 to G4 as shown in Table 1, for example.

Rank marks A to D individually corresponding to each of the groups G1 to G4, respectively, are then printed by a laser marking device (not shown), after which a product is shipped.

TABLE 1

| Reference range (μA) | Group | Rank |
| --- | --- | --- |
| $100 \leq Ic \leq 200$ | G1 | A |
| $200 \leq Ic \leq 300$ | G2 | B |
| $300 \leq Ic \leq 400$ | G3 | C |
| $400 \leq Ic \leq 500$ | G4 | D |

The photo reflector 30 according to the present invention includes a light-intensity adjuster 60 to set or adjust the photo current value, as shown in FIG. 1.

In one embodiment, for example, the light-intensity adjuster 60 is disposed in an optical path of the light emitted from the light-emitting element 42 toward an object to be detected and received by the light-receiving element 44 after the light being reflected on the object, and the light-intensity adjuster configured to control light intensity and to adjust a value of the photocurrent flowing in the light-receiving element 44. In another embodiment, the light-intensity adjuster 60 comprises laser mark 61 formed on an upper surface of the second light-transmitting resin 48 which seals the light-receiving element 44 by a radiation or shot of laser beam, as shown in FIG. 2. In one embodiment, the laser mark 61 is a concave- and convex-roughed surface formed by melting a part of the upper surface of the second light-transmitting resin 48 throughout a predetermined area by heat of the laser beam emitted from the laser marking device.

A roughness of the roughed surface can be appropriately set by a combination of conditions such as intensity, area, and time of the laser radiation.

The light-intensity adjuster 60 is configured to vary the photocurrent value by controlling an area, depth or the like of the laser mark 61. Here, as a light source of the laser beam, a YAG (Yttrium Aluminum Garnet) laser, carbon dioxide gas laser or the like is used. If the first and second light-transmitting resins 46 and 48 are made of a resin as in the photo reflector 30, use of the YAG laser enables coloring of these light-transmitting resins, while use of the carbon dioxide gas laser enables printing in a sculpted form on the light-transmitting resins.

Figure 3:
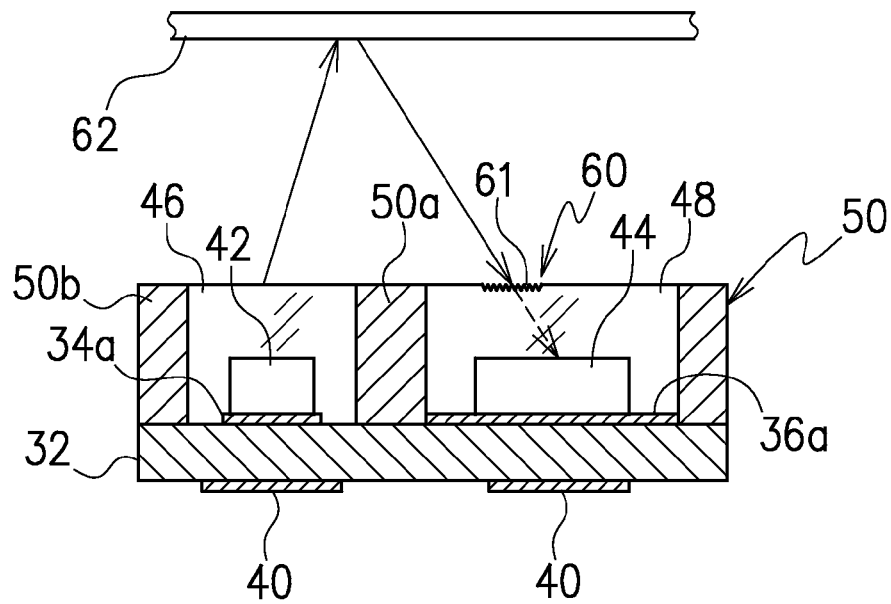
FIG. 3 is a sectional view of the photo reflector shown in FIG. 1.

When the laser beam hits the upper surface of the second light-transmitting resin 48, gaseous bubbles occur in the second light-transmitting resin 48 by the heating effect. The gasified evaporated bubbles are closed in a surface layer of the second light-transmitting resin 48 to rise in a white appearance. Because a place of the second light-transmitting resin 48 hit by the laser beam is formed in a concave and convex surface as shown in FIG. 3 by the melting of a surface of the resin, it is possible to control light intensity of light which is reflected on the detected object 62 and received by the light-receiving element 44.

Figure 4:
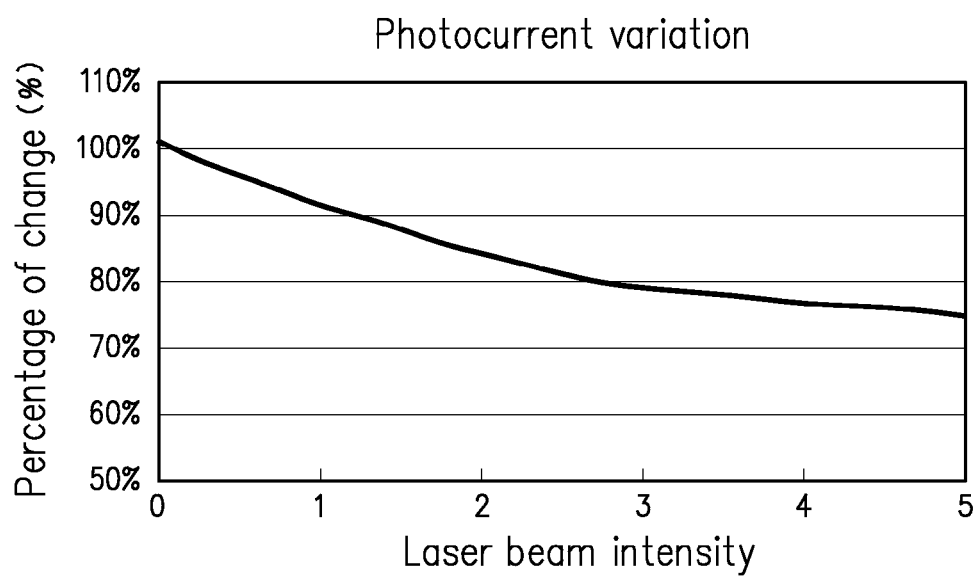
FIG. 4 is a graph showing a relationship between laser intensity and photocurrent.

FIG. 4 illustrates a graph in which changes of photocurrent value of photo reflectors with laser shots of different beam intensity are measured. In the graph, level zero (0) means a photo reflector without a laser mark provided, and the change rate of photocurrent at the level zero is set as 100%, the change rate (the percentage of change) of the photocurrent is gradually reduced as the laser beam intensity to make a laser mark increases. In particular, if the laser intensity to make the laser mark is set to the highest level 5, the photocurrent of the photo reflector is reduced by 20% or more from that of the photo reflector at the level zero. In this case, the increment of the laser intensity causes the width or depth of the irradiated marking 61 to increase and the light transmission to be reduced.

The reduction in the light transmission allows the photocurrent flowing in the light-receiving element 44 to be limited. The laser marking device can accurately aim the laser beam at a predetermined position of the second light-transmitting resin 48 which is a light-receiving surface and previously set an irradiation intensity or irradiation area; a light shielding region can therefore be accurately set, thus enabling strict control of the photocurrent.

In this embodiment, the irradiated marking 61 by the laser beam has a generally circular shape, as shown in FIGS. 1 and 2, but is not limited to this shape and may have an elliptical, square or rectangular shape depending on the degree of adjustment to the amount of light to be received.

Figure 5:
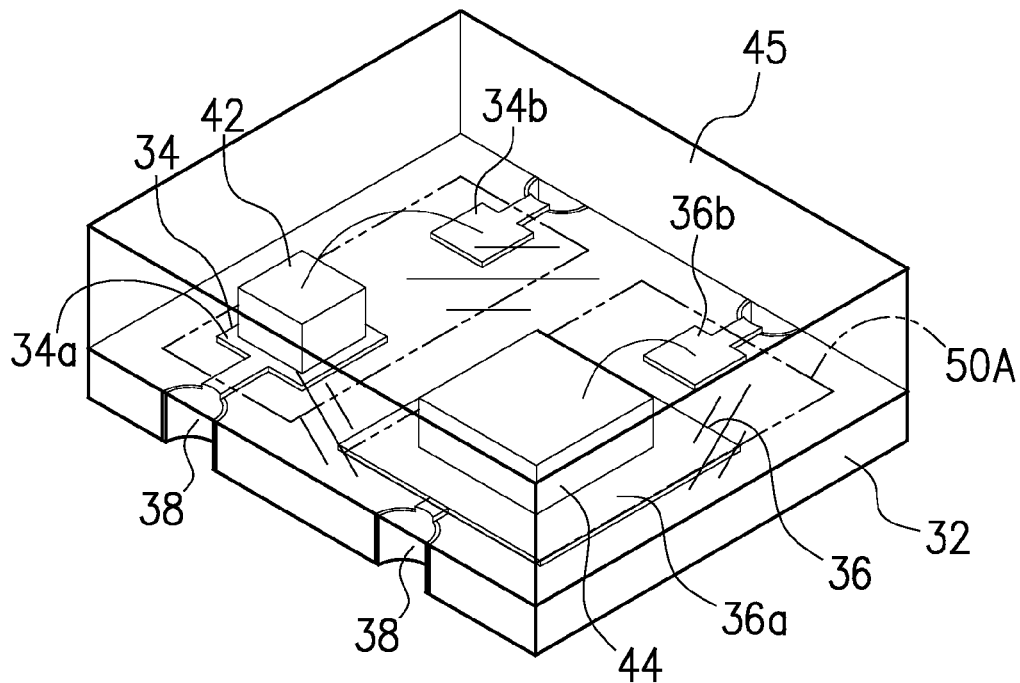
FIG. 5 is a perspective view showing a state where a sealing member of a light-transmitting resin is provided on a circuit board on which a light-emitting element and a light-receiving element are mounted, in an embodiment of the present invention.

In the photo reflector 30, the electrode patterns 34 and 36, the exterior connection terminals 38 and the electrode patterns 40 (see FIG. 3) disposed on the back surface of the circuit board 32 are formed by applying plating, deposition, printing or the like on the front and back surfaces of the circuit board 32 and in the through-holes, as shown in FIG. 5. At this time, the electrode portion 36a is widely formed in such a manner that three sides except for one side closest to the electrode portion 36b overlaps with a formed region 50A of the light-shielding member 50 formed in an after process, that is to say, a region in which the partition wall 50a and the peripheral wall 50b are formed. Next, the light emitting element 42 and the light receiving element 44 are die bonded on the electrode portions 34a and 36a and electrically connected to the electrode portions 34b and 36b through wires.

Figure 6:
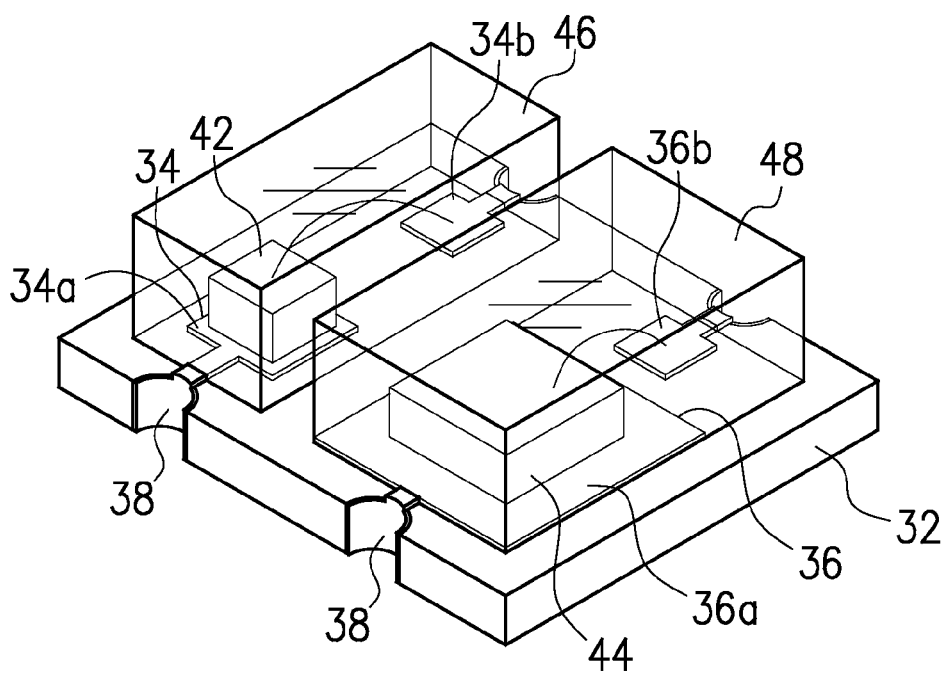
FIG. 6 is a perspective view showing a state where dicing is applied to an integral sealing member and the circuit board, in an embodiment of the present invention.

Next, an integral sealing member 45 which is formed by a light-transmitting resin is provided to seal together the light-emitting element 42 and the light-receiving element 44. The integral sealing member 45 is formed in a rectangular solid shape to cover the entire upper surface of the circuit board 32. Thereafter, the integral sealing member 45 is divided by dicing or die cutting to form the first and second light-transmitting resins 46 and 48 by cutting to make peripheral side surfaces surrounding the light-emitting element 42 and the light-receiving element, as shown in FIG. 6.

Figure 7:
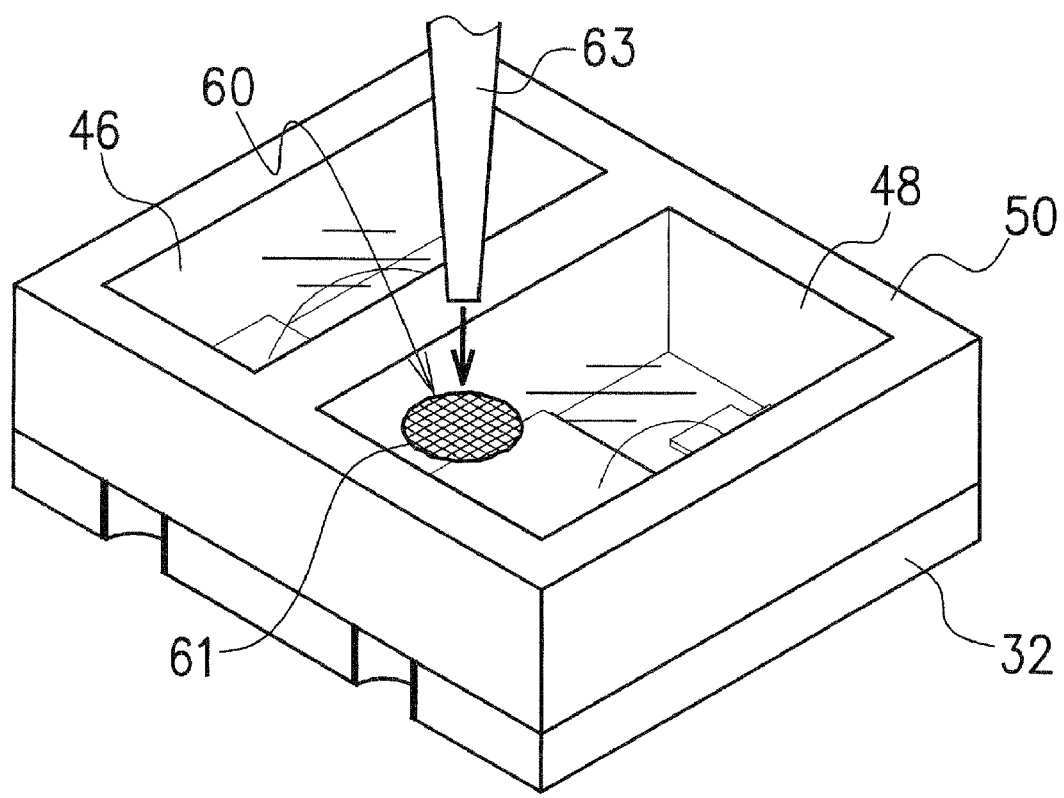
FIG. 7 is an explanatory view showing a process of applying a marking on a light-transmitting resin by a laser beam in an embodiment of the present invention.
Figure 8:
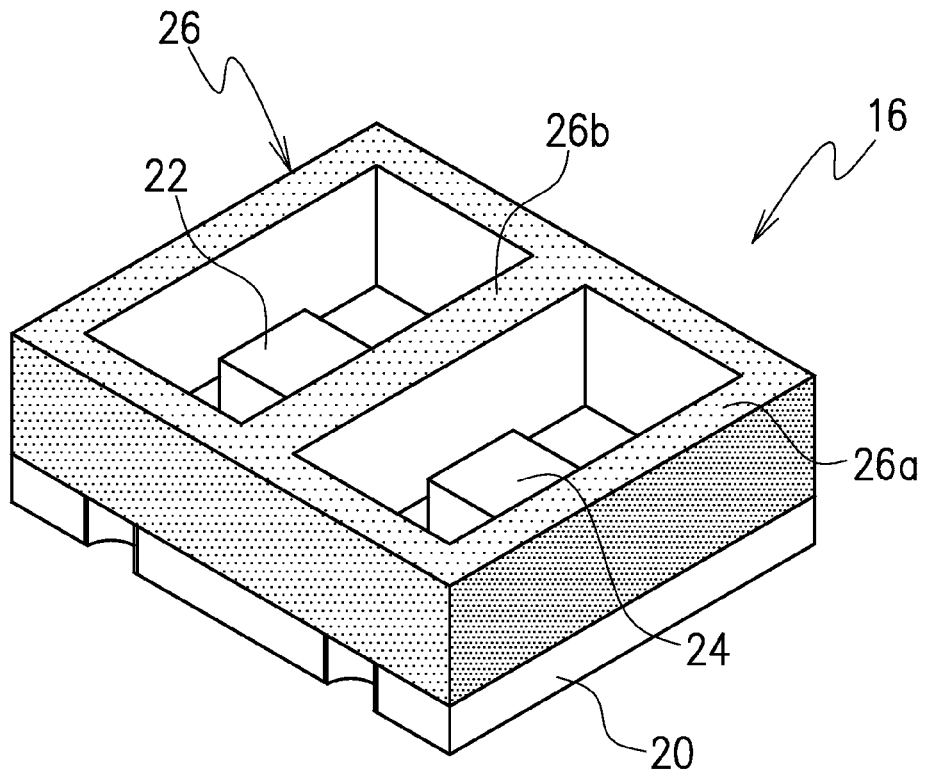
FIG. 8 is a perspective view showing a structure of a conventional photo reflector.
Figure 9:
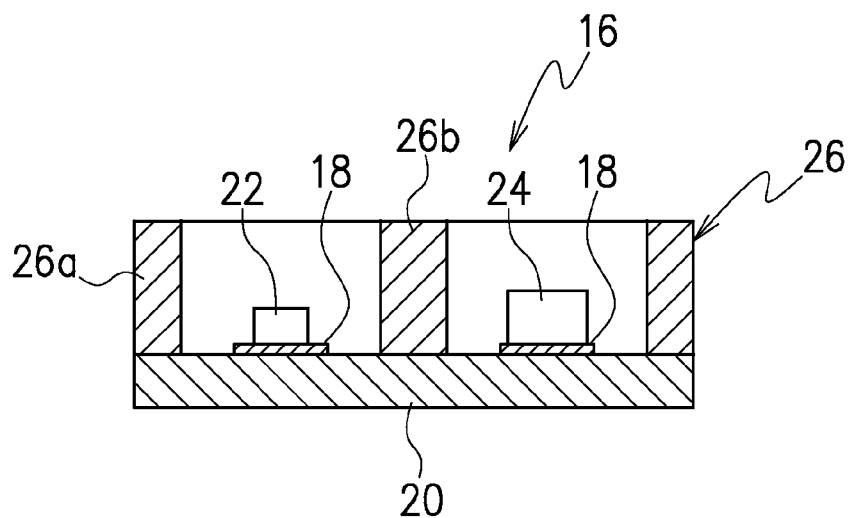
FIG. 9 is a sectional view of a conventional photo reflector shown in FIG. 8.

Next, each of defined spaces between the first and second light-transmitting resins 46 and 48 and the peripheral side surfaces of the light-transmitting resins is covered by a resin having a light-shielding property, and thereby the light-shielding member 50 is formed, as shown in FIG. 7. Subsequently, a nozzle 63 emitting a laser beam in the laser irradiation device is positioned above the second light-transmitting resin 48, and the laser beam is emitted from the nozzle 63 and irradiated to the upper surface of the second light-transmitting resin 48 through a mask (not shown) in which an irradiation window having a predetermined area or size is provided. In this way, in the embodiment, the light-intensity adjuster 60 is provided on the upper surface of the second light-transmitting resin 48 (see FIG. 7). The irradiation of the laser beam is controlled by a combination of conditions such as intensity, time and area of the laser radiation so that the photo current is in a range of groups ranked, as shown in Table 1.

As mentioned above, the photo reflector 30 according to the embodiment of the present invention makes it possible to acquire a predetermined photocurrent characteristic in a finishing process or inspection process to accomplish a fine adjustment of light emission or light-receiving sensitivity so as to be in a set range of photocurrent value, because the light-intensity adjuster 60 is provided by forming a laser mark on the surface of the resin sealing the light-receiving element 44 through the laser beam. Thereby, it is possible to inexpensively provide a photo reflector having a predetermined photocurrent characteristic.

The photo reflector 30 according to the present invention makes it possible to carry out suitable fine adjustment of the photocurrent at the time of detecting the object 62 adequately by providing the light-intensity adjuster 60 capable of adjusting the light-emission intensity or light-receiving sensitivity on either the first light-transmitting resin 46 or the second light-transmitting resin 48, or both thereof. Consequently, it is possible to provide a photo reflector having detection sensitivity appropriate to a type or material or the like of the object.

In addition, because the light-intensity adjuster 60 can be constituted using the laser marking device for application of printing or laser marking of a lot number or serial number of each of the produced photo reflectors, it is not necessary to prepare any new equipment to constitute the light-intensity adjuster 60. Moreover, because the laser marking is executed in a marking process in the finishing step of the photo reflector 30, it is possible to achieve fine adjustment by the light-intensity adjuster 60 at the time of final shipping inspection of the photo reflector. Accordingly, even if the light-emitting element 42 or the light-receiving element 44 constituting the photo reflector has a variation in inherent characteristics or there are variations in characteristic occurring with each lot in a manufacturing step, it is possible to suppress variation in detection sensitivity to a minimum.

Although the preferred embodiments of the present invention have been described, the present invention is not limited to these embodiments, and various modifications and changes can be made to the embodiments. For example, in the aforementioned embodiments, the light-intensity adjuster is provided on the second light-transmitting resin to adjust the light-receiving sensitivity, but may be provided on the first light-transmitting resin to adjust the light emission intensity, whereby adjusting a current value based on the light emission intensity. In addition, it is possible to adjust the photocurrent more precisely by providing light-intensity adjuster in appropriate positions of both the light-emitting element side and the light-receiving element side and adjusting the light-emitting intensity and light-receiving sensitivity, respectively.

What is claimed is:

1. A photo reflector including a light-emitting element and a light-receiving element, comprising:
   a circuit board;
   the light-emitting element being disposed on and electrically connected to the circuit board, the light-emitting element being configured to emit light toward an object to be detected;
   the light-receiving element being disposed on and electrically connected to the circuit board, the light-receiving element being configured to receive the light after the light is reflected on the object, the light-emitting element and the light-receiving element being disposed side by side with an interval between the light-emitting element and the light-receiving element;
   a first light-transmitting resin sealing the light-emitting element and including an upper surface as a light-emitting surface and peripheral side surfaces;
   a second light-transmitting resin sealing the light-receiving element and including an upper surface as a light-receiving surface and peripheral side surfaces;
   a light-shielding member provided in contact with the first light-transmitting resin and the second light-transmitting resin; and
   a light-intensity adjuster provided on the upper surface as the light-receiving surface of the second light-transmitting resin, and the light-intensity adjuster disposed in an optical path of the light that is emitted from the light-emitting element toward the object, and redirected toward the light-receiving element after being reflected on the object.

2. The photo reflector including a light-emitting element and a light-receiving element according to claim 1,
   wherein the light-intensity adjuster comprises a laser mark formed on the upper surface of the second light-transmitting resin.

3. The photo reflector including a light-emitting element and a light-receiving element according to claim 1,
   wherein the light-intensity adjuster comprises a concave- and convex-shaped roughed surface formed on the upper surface of the second light-transmitting resin.

4. The photo reflector including a light-emitting element and a light-receiving element according to claim 1,
   wherein the light-shielding member is disposed on the peripheral side surfaces of the first and second light-transmitting resins.

5. The photo reflector including a light-emitting element and a light-receiving element according to claim 1,
   wherein the light-shielding member includes black-colored resin.

6. The photo reflector including a light-emitting element and a light-receiving element according to claim 1,
   wherein the light-shielding member is a frame.

* * * * *